United States Patent
Huang et al.

(10) Patent No.: US 11,804,834 B2
(45) Date of Patent: Oct. 31, 2023

(54) ELECTROMAGNETIC INTERFERENCE REGULATOR BY USE OF CAPACITIVE PARAMETERS OF FIELD-EFFECT TRANSISTOR

(71) Applicant: Potens Semiconductor Corp., Hsinchu County (TW)

(72) Inventors: Wen Nan Huang, Hsinchu County (TW); Ching Kuo Chen, Hsinchu County (TW); Shiu Hui Lee, Hsinchu County (TW); Hsiang Chi Meng, Hsinchu County (TW); Cho Lan Peng, Hsinchu County (TW); Chuo Chien Tsao, Hsinchu County (TW)

(73) Assignee: POTENS SEMICONDUCTOR CORP., Zhubei (TW)

( * ) Notice: Subject to any disclaimer, the term of this patent is extended or adjusted under 35 U.S.C. 154(b) by 0 days.

(21) Appl. No.: 17/533,902

(22) Filed: Nov. 23, 2021

(65) Prior Publication Data
US 2023/0038599 A1    Feb. 9, 2023

(30) Foreign Application Priority Data

Aug. 3, 2021    (TW) ................. 110128602

(51) Int. Cl.
*H03K 17/16*    (2006.01)
*H02M 1/088*    (2006.01)

(52) U.S. Cl.
CPC .......... *H03K 17/164* (2013.01); *H02M 1/088* (2013.01)

(58) Field of Classification Search
CPC ................. H03K 17/164; H02M 1/088
See application file for complete search history.

(56) References Cited

U.S. PATENT DOCUMENTS

| 7,019,506 B2 * | 3/2006 | Kernahan | H02M 1/0845 |
| | | | 323/284 |
| 10,498,212 B2 | 12/2019 | Chang et al. | |
| 2009/0085619 A1* | 4/2009 | Westwick | H03K 17/22 |
| | | | 327/143 |
| 2019/0296751 A1* | 9/2019 | Zhang | H01L 27/0629 |

(Continued)

FOREIGN PATENT DOCUMENTS

| CN | 101529704 A | * | 9/2009 | ............. H02M 1/08 |
| CN | 102097937 A | * | 6/2011 | |
| CN | 101582599 B | * | 7/2011 | |

(Continued)

*Primary Examiner* — Metasebia T Retebo
*Assistant Examiner* — James G Yeaman
(74) *Attorney, Agent, or Firm* — Muncy, Geissler, Olds & Lowe, P.C.

(57) ABSTRACT

An electromagnetic interference regulator by use of capacitive parameters of the field-effect transistor for detecting the induced voltage and the induced current of the field-effect transistor to determine whether the operating frequency of the field-effect transistor is within the preset special management frequency of electromagnetic interference. When the basic frequency and the multiplied frequency exceed the limit, the content of the external capacitor unit can be adjusted to assist the products using field-effect transistors to maintain excellent electromagnetic interference adjustment capabilities under various loads, thereby optimizing the characteristics of electromagnetic interference.

4 Claims, 10 Drawing Sheets

(56) References Cited

U.S. PATENT DOCUMENTS

2021/0082267 A1 * 3/2021 Yan ................... G01K 3/005

FOREIGN PATENT DOCUMENTS

| CN | 102117156 | A | * | 7/2011 | | |
|---|---|---|---|---|---|---|
| CN | 101464826 | B | * | 8/2012 | ............... | G06F 1/08 |
| CN | 102665147 | A | * | 9/2012 | | |
| CN | 202797901 | U | * | 3/2013 | | |
| CN | 203491682 | U | * | 3/2014 | | |
| CN | 204886431 | U | * | 12/2015 | | |
| CN | 105337262 | A | * | 2/2016 | | |
| CN | 205193693 | U | * | 4/2016 | ............... | G06F 1/16 |
| CN | 105486940 | B | * | 7/2018 | | |
| CN | 108377095 | A | | 8/2018 | | |
| CN | 207689656 | U | * | 8/2018 | | |
| CN | 109100977 | A | * | 12/2018 | | |
| CN | 208316596 | U | * | 1/2019 | | |
| CN | 209516910 | U | * | 10/2019 | | |
| CN | 111917282 | A | * | 11/2020 | ............... | H02M 1/00 |
| CN | 112398334 | A | * | 2/2021 | | |
| CN | 212627895 | U | | 2/2021 | | |
| CN | 110071105 | B | * | 3/2021 | ......... | H01L 27/0207 |
| CN | 112590686 | A | * | 4/2021 | ......... | B60R 16/0231 |
| CN | 112910412 | A | * | 6/2021 | ............... | H03B 5/04 |
| EP | 0399201 | A1 | * | 11/1990 | | |
| JP | 2002344712 | A | * | 11/2002 | ............ | H04M 11/06 |
| JP | 2007324018 | A | * | 12/2007 | ............ | H05B 6/685 |
| JP | 4447655 | B1 | * | 4/2010 | ............ | H02M 5/293 |
| JP | 2010287503 | A | * | 12/2010 | | |
| JP | 2014128131 | A | * | 7/2014 | | |
| JP | 2020188538 | A | * | 11/2020 | | |
| KR | 940005058 | B1 | * | 6/1994 | | |
| TW | 528939 | B | * | 4/2003 | | |
| TW | 201023523 | A | * | 6/2010 | ........... | H03H 11/265 |
| TW | I443957 | B | | 7/2014 | | |
| TW | 202101016 | A | * | 1/2021 | | |
| WO | WO-2016008248 | A1 | * | 1/2016 | ........... | G09G 3/3233 |

* cited by examiner

ELECTROMAGNETIC INTERFERENCE REGULATOR BY USE OF CAPACITIVE PARAMETERS OF FIELD-EFFECT TRANSISTOR

BACKGROUND OF INVENTION

(1) Field of the Present Disclosure

The present disclosure relates to an electromagnetic interference regulator, and more particularly to an electromagnetic interference regulator employing the field-effect transistor capacitance parameters to adjust electromagnetic interference.

(2) Brief Description of Related Art

Electronic circuits are usually susceptible to electromagnetic Interference (EMI) during operation, thereby reducing their performance. Especially when the electronic circuit is in the frequency multiplication state or the high frequency state, the ringing of the transistor switch is also intensified so that a serious electromagnetic interference begins to occur.

There are many solutions to reduce electromagnetic interference, such as: CN108377095A "Ringing Amplitude Measurement and Mitigation", which uses a peak detector to measure the amplitude of the ringing voltage, adjusts the control signal of the switch through the switch driver to further adjust the amplitude of the ringing voltage for reducing electromagnetic interference. Other prior arts are TWI443957B "High-efficiency Power Converter System", and U.S. Pat. No. 10,498,212B2 "Gate Driver", etc.

Accordingly, how to reduce the electromagnetic interference generated when the electronic circuit is in the frequency multiplication or high frequency state, and then assist the products using the transistor switch to maintain excellent electromagnetic interference adjustment ability under various loads, is a problem to be solved.

SUMMARY OF INVENTION

It is a primary object of the present disclosure to provide an electromagnetic interference regulator which can assist products using field-effect transistors to maintain excellent electromagnetic interference adjustment capabilities under various loads, thereby optimizing electromagnetic interference characteristics. The induced voltage and induced current of the field-effect transistor are detected to determine whether an operating frequency of the field-effect transistor is in a preset state; that is, whether the field effect transistor is within the preset special management frequency of electromagnetic interference. When the relationship between the basic frequency and the multiplied frequency exceeds the limit, the content of the external capacitor unit can be adjusted.

DETAILED DESCRIPTION OF PREFERRED EMBODIMENTS

Figure 1:
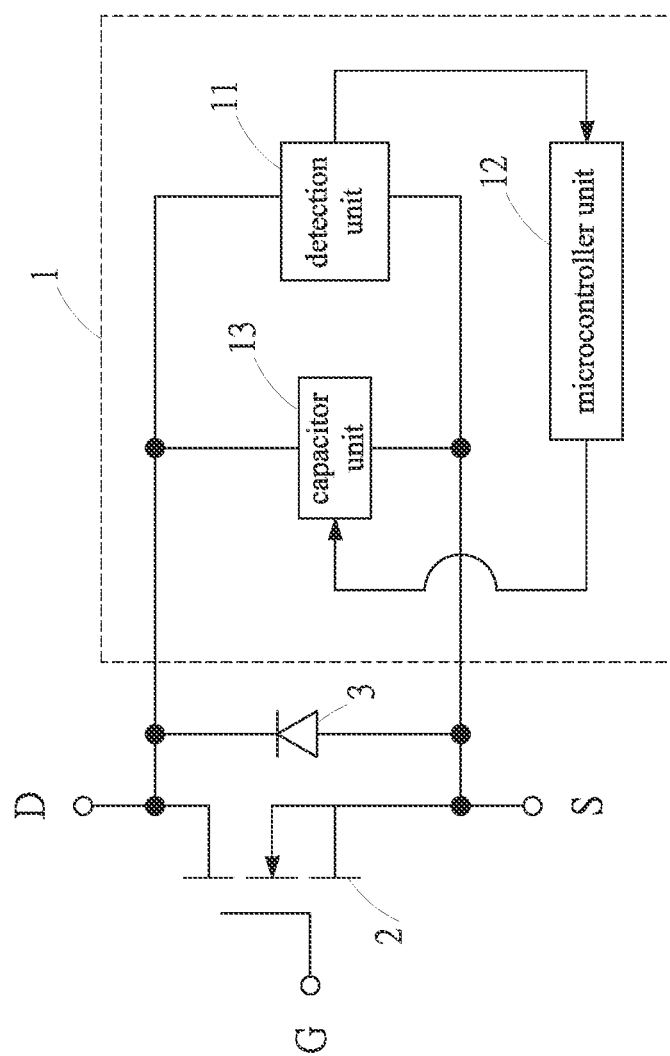
FIG. 1 is a block diagram of a circuit according to the present disclosure.

Referring to FIG. 1, an electromagnetic interference regulator 1 of the present disclosure is electrically connected to a field-effect transistor 2 and a diode 3. The electromagnetic interference regulator 1 may include a detection unit 11, a microcontroller unit 12, and a capacitor unit 13. The detection unit 11 can be one or a combination of a voltage detection circuit and a current detection circuit, and is electrically connected to the microcontroller unit 12 and the capacitor unit 13. The microcontroller unit 12 can be a micro control unit (MCU) or a control IC. The capacitor unit 13 may include a plurality of capacitors and a plurality of switches.

Figure 2:
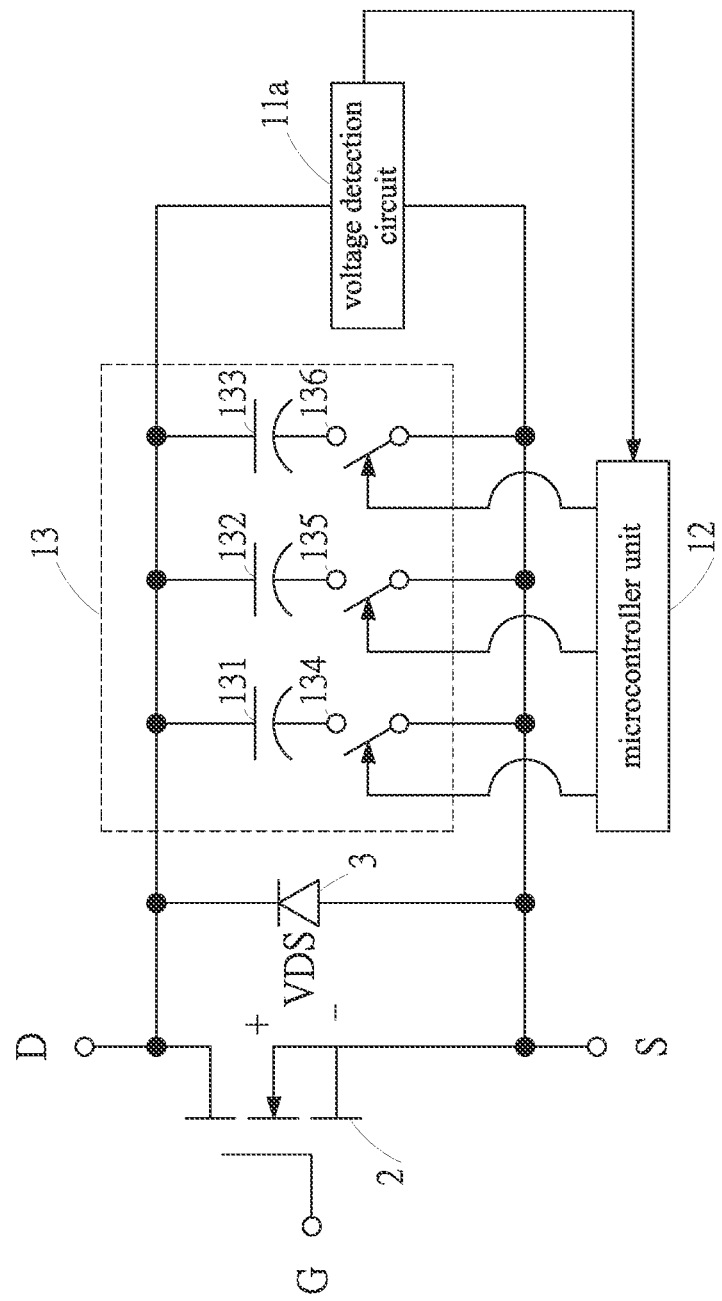
FIG. 2 is a first embodiment according to the present disclosure.

Referring to FIG. 2, in one embodiment, the detection unit 11 is a voltage detection circuit 11a, one end of the detection unit 11 is electrically connected to a drain D of the field-effect transistor 2, and the other end of the detection unit 11 is electrically connected to a source S of the field-effect transistor 2, thereby capturing a voltage $V_{DS}$ between the drain D and the source S. The capacitor unit 13 includes a first capacitor 131, a second capacitor 132, a third capacitor 133, a first switch 134, a second switch 135, and a third switch 136. One end of each of the first capacitor 131, the second capacitor 132, and the third capacitor 133 is electrically connected to the drain D of the field-effect transistor 2 while the other end of the first capacitor 131 is electrically connected to one end of the first switch 134, the other end of the second capacitor 132 is electrically connected to one end of the second switch 135, and the other end of the third capacitor 133 is electrically connected to one end of the third switch 136. The other end of each of the first switch 134, the second switch 135, and the third switch 136 is electrically connected to the source S of the field-effect transistor 2 and the detection unit 11. The microcontroller unit 12 is electrically connected to the detection unit 11, the first switch 134, the second switch 135, and the third switch 136 for receiving a detection signal (such as the voltage $V_{DS}$ between the drain D and the source S) transmitted by the detection unit 11. According to a period of a waveform of the voltage $V_{DS}$, an operating frequency of the field-effect transistor 2 is calculated by the microcontroller unit 12 to determine whether the field-effect transistor 2 is within the preset special management frequency of electromagnetic interference. In this way, a control signal is transmitted to the capacitor unit 13 for controlling the on/off state of the first switch 134, the second switch 135, and the third switch 136 to adjust the impedance of the capacitor unit 13.

Figure 3:
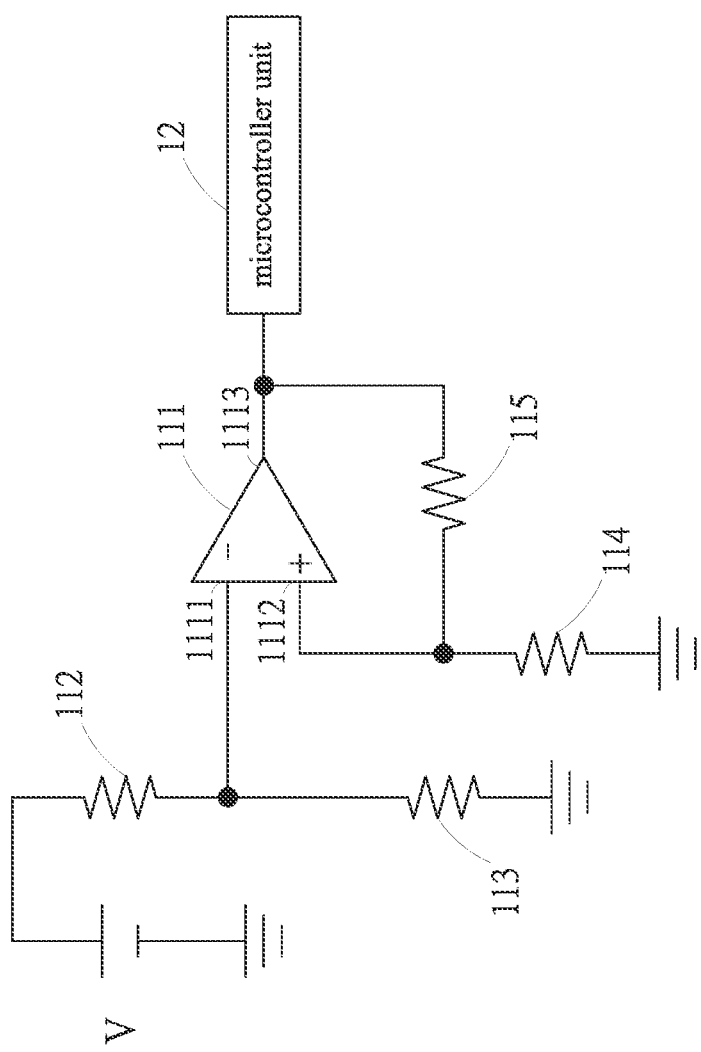
FIG. 3 is a circuit diagram of a detection unit according to the first embodiment of the present disclosure.

Referring to FIG. 3, the detection unit 11 may include a DC voltage source V, a comparator 111, a first resistor 112, a second resistor 113, a third resistor 114, and a fourth resistor 115. The comparator 111 may include an inverting input end 1111, a non-inverting input end 1112, and an output end 1113. The DC voltage source V can be a voltage $V_{DS}$ between the drain D and the source S of the field-effect transistor 2. The inverting input end 1111 is electrically connected to the DC voltage source 110 through the first resistor 112, and is electrically connected to the ground through the second resistor 113. The non-inverting input end 1112 is electrically connected to the ground through the third resistor 114, and is electrically connected to the output end 1113 and the microcontroller unit 12 through the fourth resistor 115. Moreover, the output end 1113 is electrically connected to the microcontroller unit 12.

Figure 4:
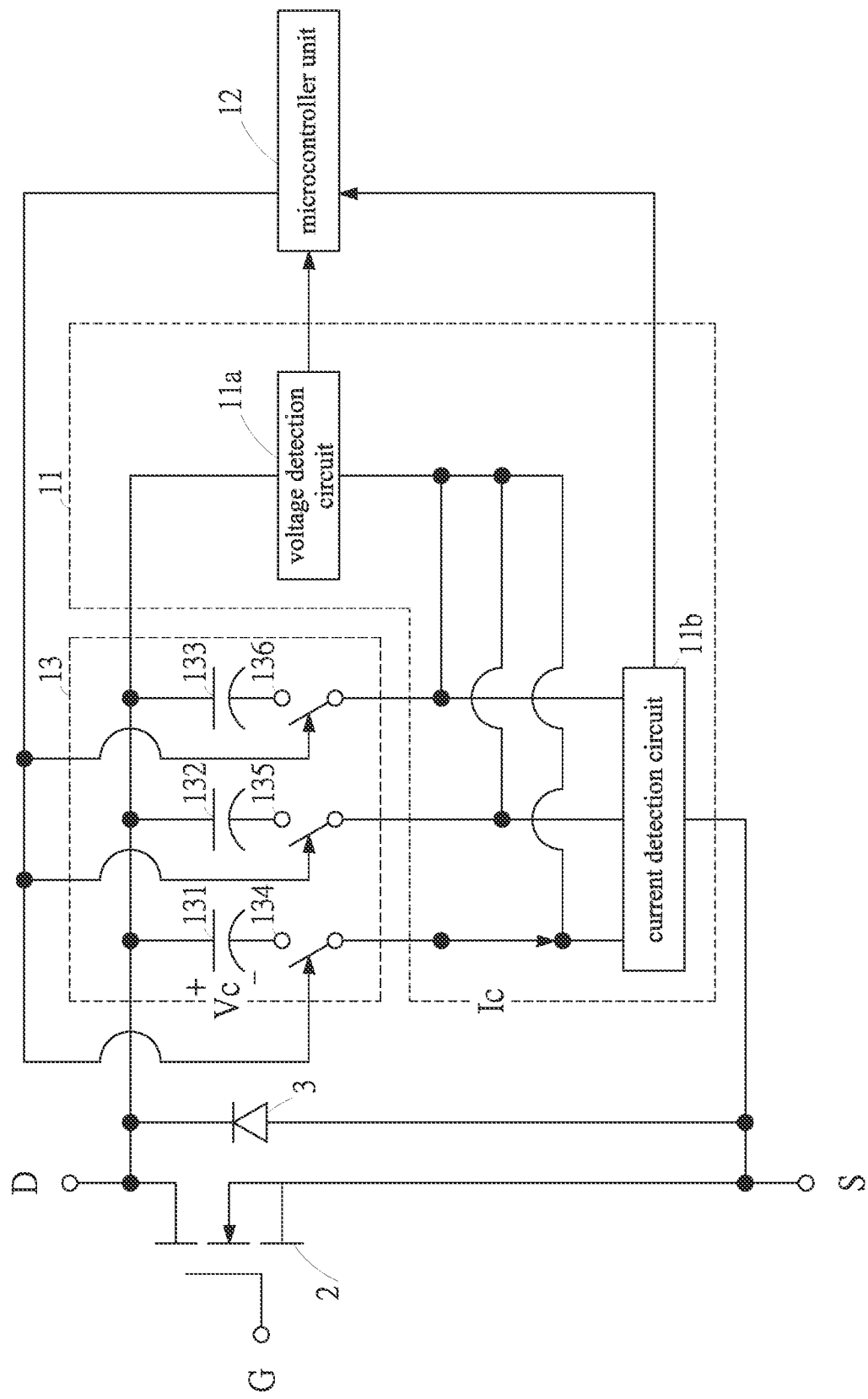
FIG. 4 is a second embodiment according to the present disclosure.

Referring to FIG. 4, in another embodiment, the detection unit 11 includes the voltage detection circuit 11a and a current detection circuit 11b. One end of the detection unit 11 is electrically connected to the drain D of the field-effect transistor 2 while the other end of the detection unit 11 is electrically connected to the source S of the field-effect transistor 2. The voltage detection circuit 11a is connected in parallel with the capacitor unit 13 to capture a capacitive voltage $V_C$ (such as an induced voltage) of the capacitor unit 13. The current detection circuit 11b is connected in series with the capacitor unit 13 to capture a capacitive current $I_C$ (such as an induced current) of the capacitor unit 13. The capacitor unit 13 includes the first capacitor 131, the second capacitor 132, the third capacitor 133, the first switch 134, the second switch 135, and the third switch 136. One end of each of the first capacitor 131, the second capacitor 132, and the third capacitor 133 is electrically connected to the drain D of the field-effect transistor 2 while the other end of the first capacitor 131 is electrically connected to one end of the first switch 134, the other end of the second capacitor 132 is electrically connected to one end of the second switch 135, and the other end of the third capacitor 133 is electrically connected to one end of the third switch 136. The other end of each of the first switch 134, the second switch 135, and the third switch 136 is electrically connected to the voltage detection circuit 11a and the current detection circuit 11b. The voltage detection circuit 11a is electrically connected to the drain D of the field-effect transistor 2. The current detection circuit 11b is electrically connected to the source S of the field-effect transistor 2. Moreover, the microcontroller unit 12 is electrically connected to the detection unit 11, the first switch 34, the second switch 35, and the third switch 36. The microcontroller unit 12 is used to receive the detection signal (such as the capacitive voltage $V_C$ and the capacitive current $I_C$ of the capacitor unit 13) transmitted by the detection unit 11. According to the period of the capacitive voltage $V_C$ and the capacitive current $I_C$, an operating frequency of the field-effect transistor 2 is calculated to determine whether the field-effect transistor 2 is within the preset special management frequency of electromagnetic interference. In this way, a control signal is transmitted to the capacitor unit 13 for controlling the on/off state of the first switch 134, the second switch 135, and the third switch 136 to adjust the impedance of the capacitor unit 13.

Figure 5:
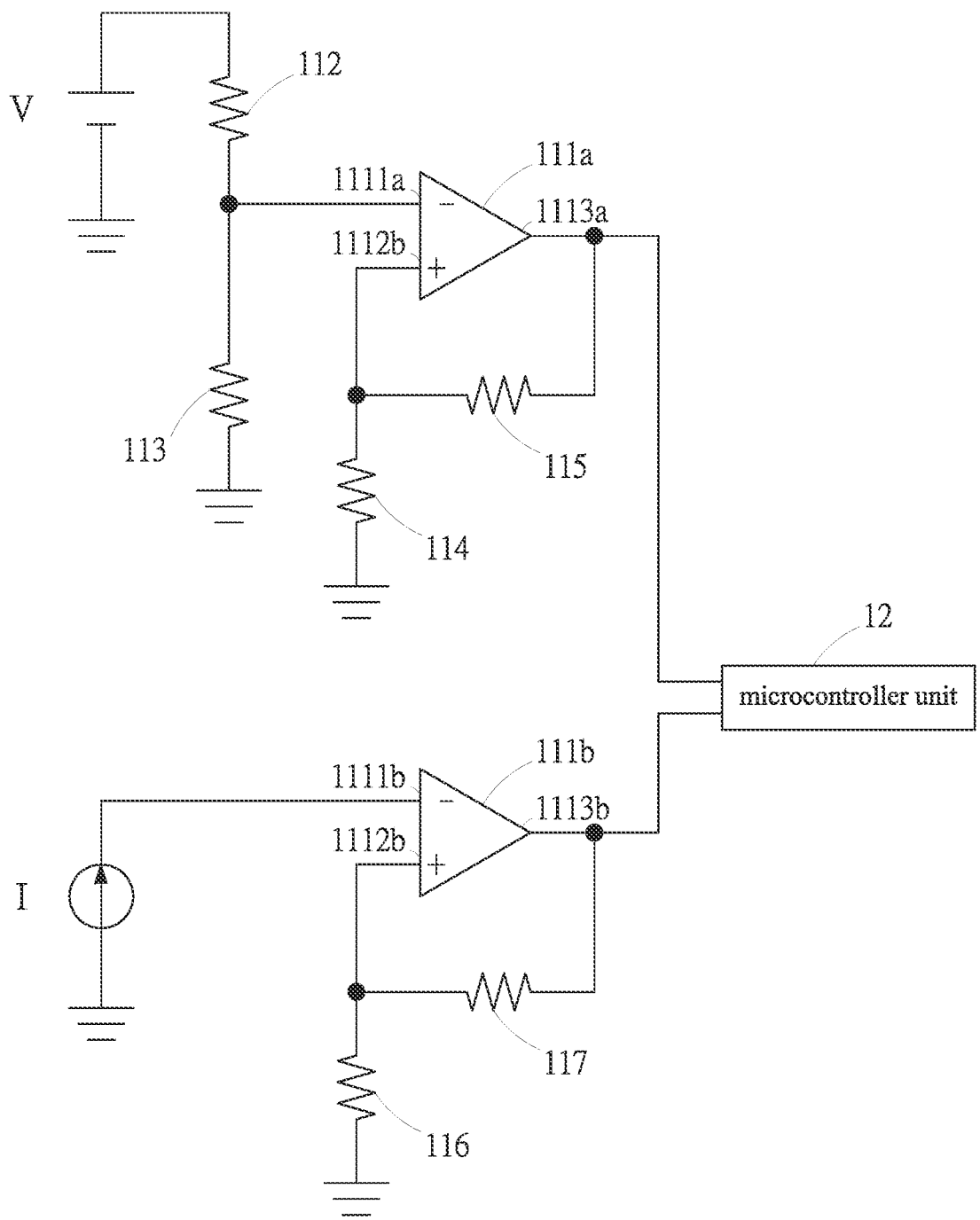
FIG. 5 is a circuit diagram of a detection unit according to the second embodiment of the present disclosure.

Referring to FIG. 5, the detection unit 11 may include the DC voltage source V, a DC current source I, a first comparator 111a, a second comparator 111b, the first resistor 112, the second resistor 113, the third resistor 114, the fourth resistor 115, a fifth resistor 116, and a sixth resistor 117. The first comparator 111a may include a first inverting input end 1111a, a first non-inverting input end 1112a, and a first output end 1113a. The second comparator 111b may include a second inverting input end 1111b, a second non-inverting input end 1112b, and a second output end 1113b. The DC voltage source V can be the capacitive voltage $V_C$ of the capacitor unit 13. The DC current source I can be the capacitive current $I_C$ of the capacitor unit 13. The first inverting input end 1111a is electrically connected to the DC voltage source V through the first resistor 112, and is electrically connected to the ground through the second resistor 113. The first non-inverting input end 1112a is electrically connected to the ground through the third resistor 114, and is electrically connected to the first output end 1113a and the microcontroller unit 12 through the fourth resistor 115. The first output end 1113a is electrically connected to the microcontroller unit 12. The second comparator 111b is electrically connected to the DC current source I. The non-inverting input end 1112b is electrically connected to the ground through the fifth resistor 116, and is electrically connected to the second output end 1113b and the microcontroller unit 12 through the sixth resistor 117. The second output end 1113b is electrically connected to the microcontroller unit 12.

Figure 6:
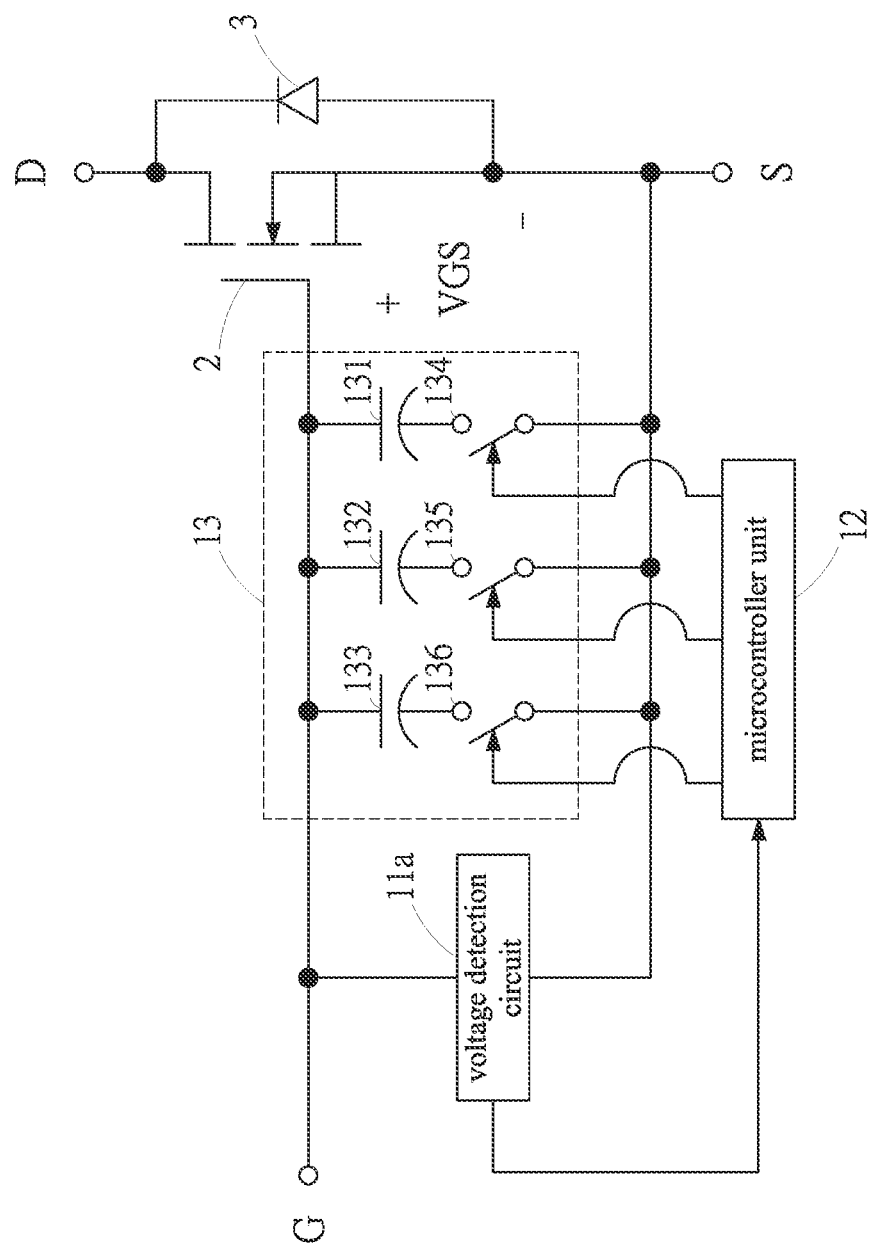
FIG. 6 is a third embodiment according to the present disclosure.

Referring to FIG. 6, in another embodiment, the detection unit 11 is the voltage detection circuit 11a, one end of the detection unit 11 is electrically connected to the gate G of the field-effect transistor 2 while the other end of the detection unit 11 is electrically connected to the source S of the field-effect transistor 2, thereby capturing a voltage $V_{GS}$ between the gate G and the source S. One end of each of the first capacitor 131, the second capacitor 132, and the third capacitor 133 of the capacitor unit 13 is electrically connected to the gate G of the field-effect transistor 2. One end of each of the first switch 134, the second switch 135, and the third switch 136 is electrically connected to the source S of the field-effect transistor 2 and the detection unit 11. According to a period of a waveform of the voltage $V_{GS}$, an operating frequency of the field-effect transistor 2 is calculated by the microcontroller unit 12 to determine whether the field-effect transistor 2 is within the preset special management frequency of electromagnetic interference. In this way, a control signal is transmitted to the capacitor unit 13 for controlling the on/off state of the first switch 134, the second switch 135, and the third switch 136 to adjust the impedance of the capacitor unit 13.

Figure 7:
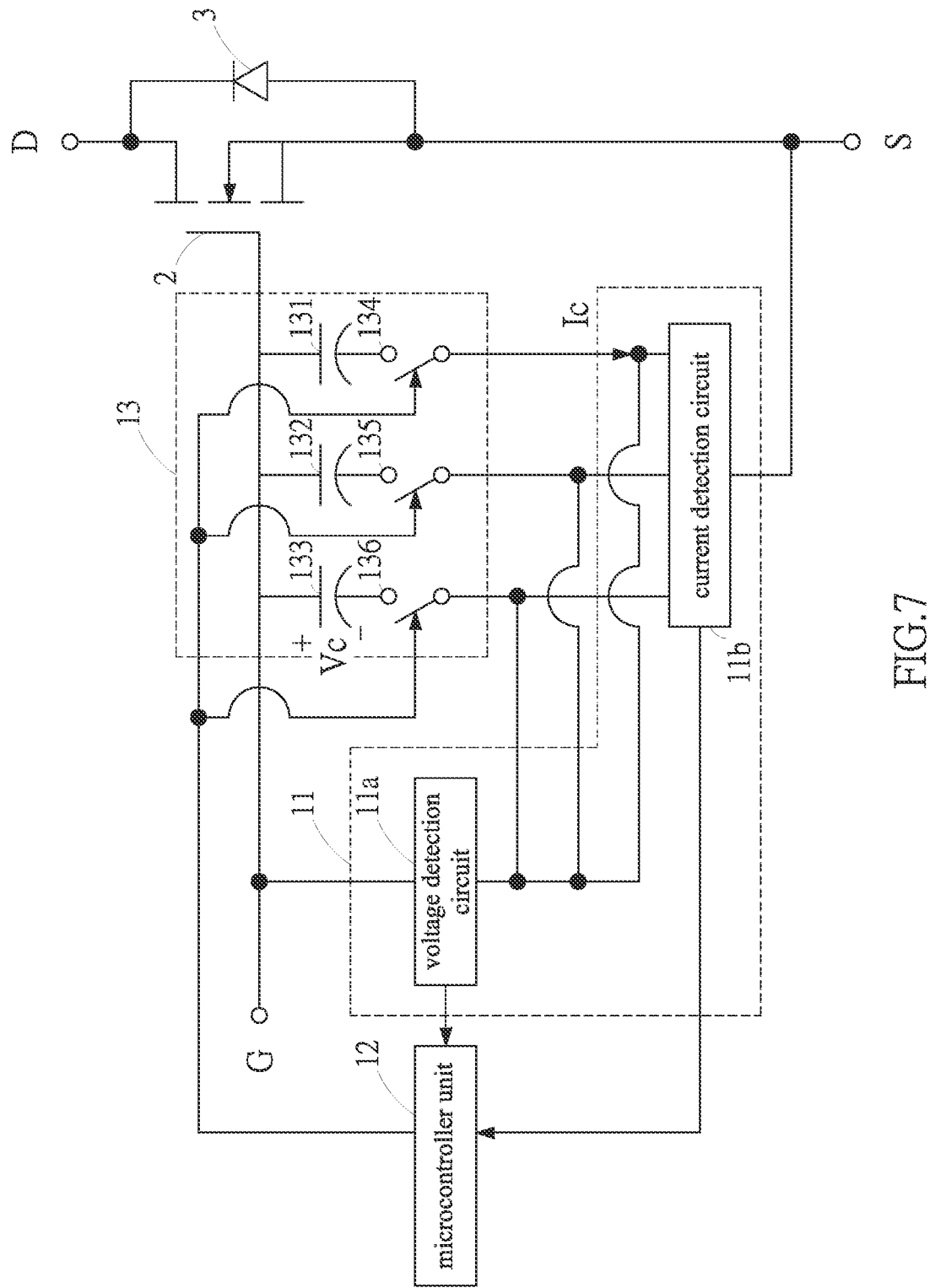
FIG. 7 is a fourth embodiment according to the present disclosure.

Referring to FIG. 7, in another embodiment, the detection unit 11 includes the voltage detection circuit 11a and the current detection circuit 11b. One end of the detection unit 11 is electrically connected to the gate G of the field-effect transistor 2 while the other end thereof is electrically connected to the source S of the field-effect transistor 2. Moreover, the voltage detection circuit 11a and one end of each of the first capacitor 131, the second capacitor 132, and the third capacitor 133 of the capacitor unit 13 are electrically connected to the gate G of the field-effect transistor 2 while the current detection circuit 11b is electrically connected to the source S of the field-effect transistor 2.

Figure 8:
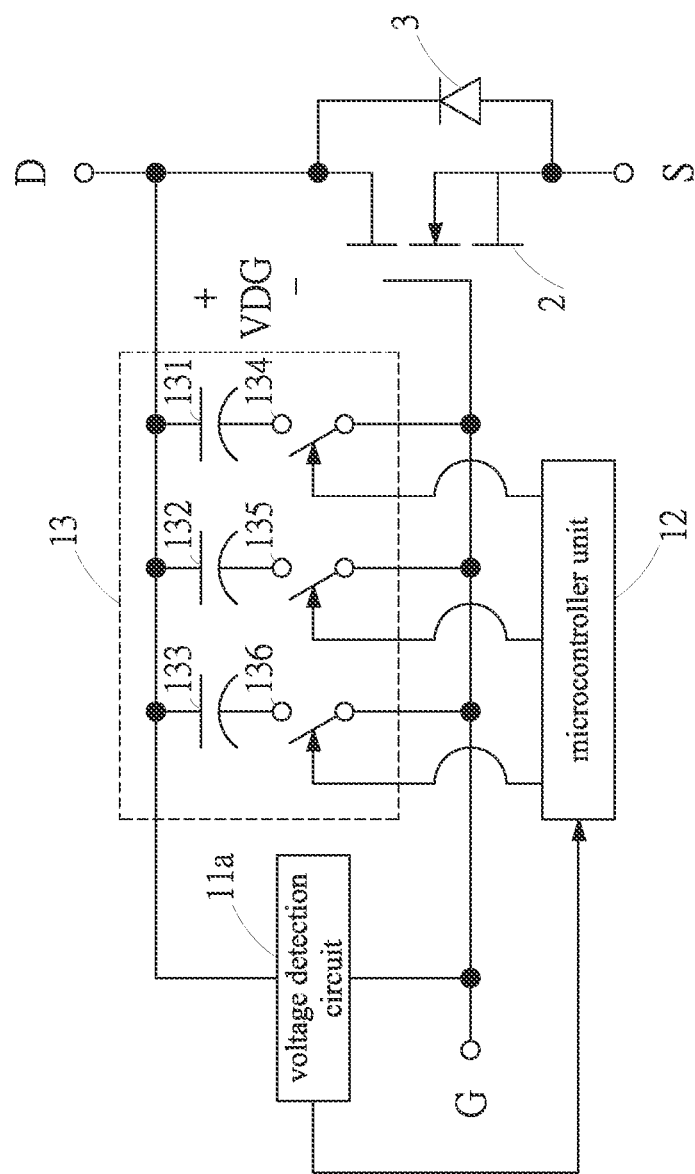
FIG. 8 is a fifth embodiment according to the present disclosure.

Referring to FIG. 8, in another embodiment, the detection unit 11 is the voltage detection circuit 11a. One end of the detection circuit 11 is electrically connected to the drain D of the field-effect transistor 2 while the other end of the detection circuit 11 is electrically connected to the gate G of the field-effect transistor 2, thereby capturing a voltage $V_{DG}$ between the drain D and the gate G. Moreover, one end of each of the first capacitor 131, the second capacitor 132, and the third capacitor 133 of the capacitor unit 13 is electrically connected to the gate G of the field-effect transistor 2. One end of each of the first switch 134, the second switch 135, and the third switch 136 of the capacitor unit 13 is electrically connected to the drain D of the field-effect transistor 2 and the detection unit 11. According to a period of a waveform of the voltage $V_{DS}$, an operating frequency of the field-effect transistor 2 is calculated by the microcontroller unit 12 to determine whether the field-effect transistor 2 is within the preset special management frequency of electromagnetic interference. In this way, a control signal is transmitted to the capacitor unit 13 for controlling the on/off state of the first switch 134, the second switch 135, and the third switch 136 to adjust the impedance of the capacitor unit 13.

Figure 9:
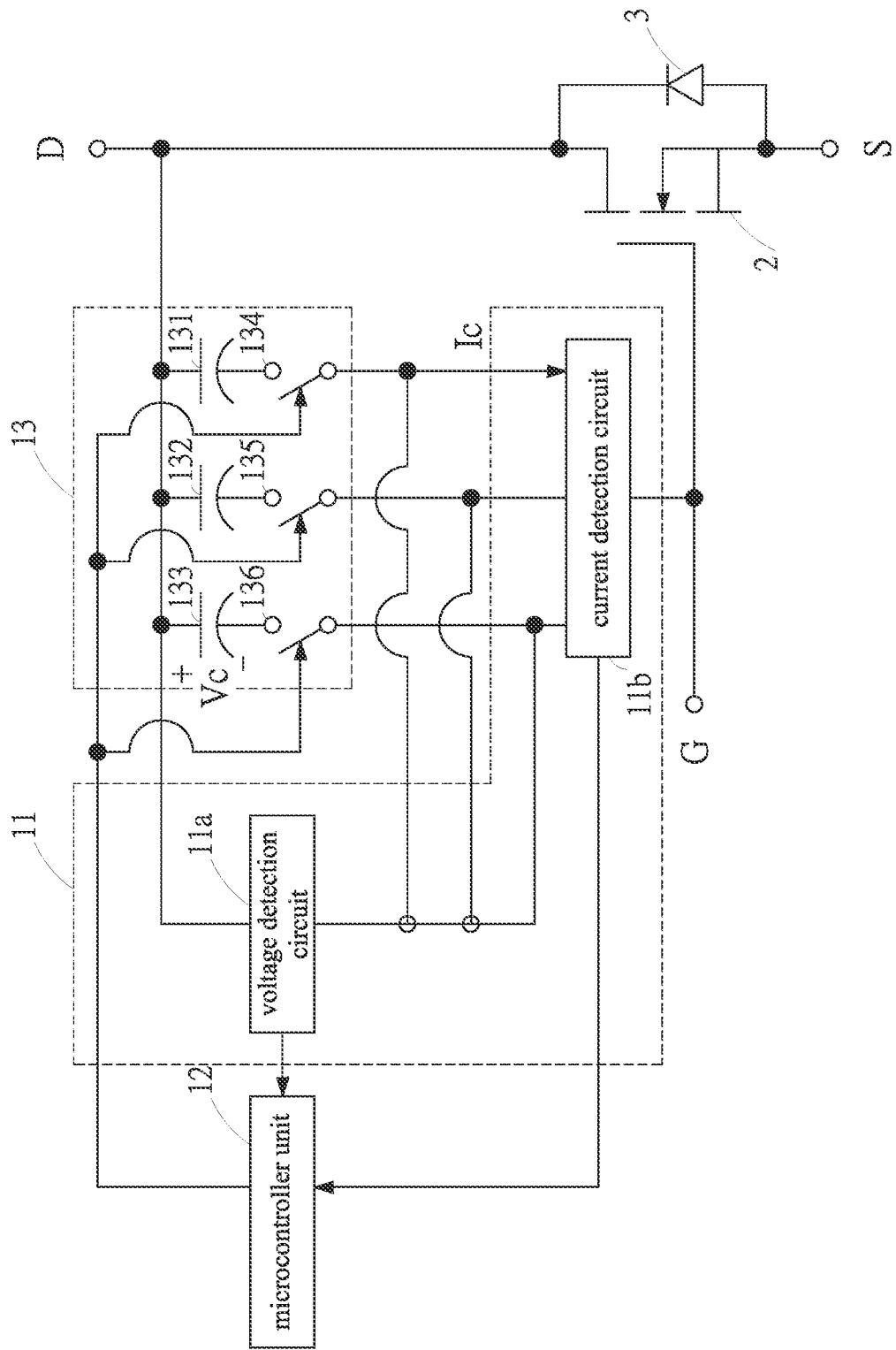
FIG. 9 is a sixth embodiment according to the present disclosure.

Referring to FIG. 9, in anther embodiment, the detection unit 11 includes the voltage detection circuit 11a and the current detection circuit 11b. One end of the detection unit 11 is electrically connected to the drain D of the field-effect transistor 2 while the other end of the detection unit 11 is electrically connected to the gate U of the field-effect transistor 2. Moreover, the voltage detection circuit 11a and one end of each of the first capacitor 131, the second capacitor 132, and the third capacitor 133 of the capacitor unit 13 is electrically connected to the drain D of the field-effect transistor 2 while the current detection circuit 11b is electrically connected to the gate G of the field-effect transistor 2.

Figure 10:
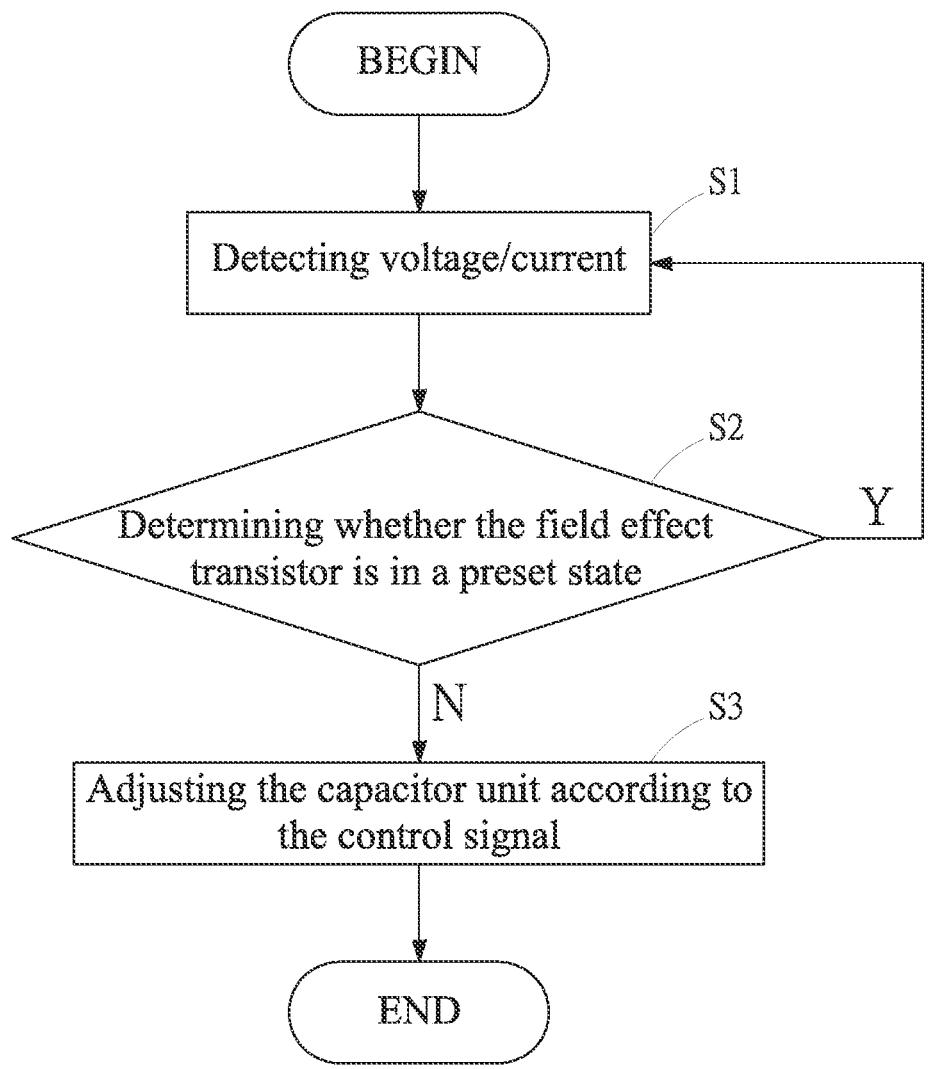
FIG. 10 is a flow chart of an implementation method according to the present disclosure.

Referring to FIG. 10, a method of controlling the electromagnetic interference regulator of the present disclosure includes following steps:

Step S1: Detecting voltage/current, wherein a detection unit 11 captures a detection signal from a field-effect transistor 2 or a capacitor unit 13 and transmits it to a microcontroller unit 12.

In an embodiment, the detection unit 11 captures a voltage $V_{DS}$, a voltage $V_{DG}$, or a voltage $V_{GS}$ between any two ends of a drain D, a source S, and a gate G of the field-effect transistor 2; In another embodiment, the detection unit 11 captures a capacitive voltage $V_C$ (such as an induced voltage) and a capacitive current $I_C$ (such as an induced current) of the capacitor unit 13.

Step S2: Determining whether the field-effect transistor is in a preset state, wherein the microcontroller unit 12 determines whether the field-effect transistor 2 is in a preset state according to the detection signal, that is, it determines whether the field-effect transistor 2 is in a preset special management frequency of electromagnetic interference. If it is not the case (that is, in a frequency multiplication state), the microcontroller unit 12 sends a control signal to the capacitor unit 13; if it is the case (that is, in the preset state), the detection unit 11 continuously captures new detection signals.

In one embodiment, an operating frequency of the field-effect transistor 2 is calculated by the microcontroller unit 12 according to a period of a waveform of the voltage $V_{DS}$ to determine whether the field-effect transistor 2 is within the preset special management frequency of electromagnetic interference. In another embodiment, an operating frequency of the field-effect transistor 2 is calculated by the microcontroller unit 12 according to the capacitive voltage and the capacitive current $I_C$ of the capacitor unit 13 to determine whether the field-effect transistor 2 is within the preset special management frequency of electromagnetic interference.

Step S3: Adjusting the capacitor unit 13 according to the control signal, wherein a first switch 134, a second switch 135, or a third switch 136 is turned on or off according to the control signal so as to adjust the impedance through the capacitance parameters of a first capacitor 131, a second capacitor 132, or a third capacitor 133, thereby adjusting the operating frequency of the field-effect transistor 2. In this way, the electromagnetic interference regulator can help products using field-effect transistors maintain excellent electromagnetic interference adjustment capabilities under various loads.

In one embodiment, when the operating frequency of the field-effect transistor 2 is 50 kHz~60 kHz, the microcontroller unit 12 transmits a control signal for controlling the first switch 134, so that the first capacitor 131 is connected in parallel with the field-effect transistor 2. When the operating frequency of the field-effect transistor 2 is 60 kHz~70 kHz, the microcontroller unit 12 transmits a control signal for controlling the first switch 134 and the second switch 135, so that the first capacitor 131 and the second capacitor 132 are connected in parallel with the field-effect transistor 2. When the operating frequency of the field-effect transistor 2 is 70 kHz~80 kHz, the microcontroller unit 12 transmits a control signal for controlling the first switch 134, the second switch 135, and the third switch 136, so that the first capacitor 131 and the second capacitor 132, and the third capacitor 133 are connected in parallel with the field-effect transistor 2.

It can be seen from the above-mentioned description that the present disclosure mainly captures the voltage of the field-effect transistor or the induced voltage and the induced current of the capacitor unit through the detection unit to determine whether the operating frequency of the field-effect transistor is in the preset special management frequency of electromagnetic interference. When the basic frequency and the multiplied frequency exceed the limit, the plurality capacitors and the plurality switches of the capacitor unit can be adjusted. The impedance can be adjusted through the capacitance parameters of each capacitor, thereby adjusting the operating frequency of the field-effect transistor. In this way, after the present disclosure is implemented, it can indeed achieve the purpose of providing an electromagnetic interference regulator that assists in the application of field-effect transistors under various loads, thereby maintaining excellent electromagnetic interference adjustment capabilities and optimizing electromagnetic interference characteristics.

REFERENCE SIGN 1 electromagnetic interference regulator
2 field-effect transistor
3 diode
11 detection unit
11a voltage detection circuit
11b current detection circuit
111 comparator
111a first comparator
1112 non-inverting input end
1112a first non-inverting input end
1113 output end
1113a first output end
111b second comparator
1111b second inverting input end
1112b non-inverting input end
1113b second output end
112 first resistor
113 second resistor
114 third resistor
115 fourth resistor
116 fifth resistor
117 sixth resistor
12 microcontroller unit
13 capacitor unit
131 first capacitor
132 second capacitor
133 third capacitor
134 first switch 135 second switch
136 third switch
V DC voltage source
DC current source
D drain
C gate
S source
$V_{a}s$ voltage between the drain and the source
$V_{DG}$ voltage between the drain and the gate
$V_{GS}$ voltage between the gate and the source
$V_C$ capacitive voltage
$I_C$ capacitive current
S1 detecting voltage/current
S2 determining whether the field-effect transistor is in a preset state
S3 adjusting the capacitor unit according to the control signal

What is claimed is:

1. An electromagnetic interference regulator electrically connected to a field-effect transistor, comprising:
  a detection unit, configured to capture a detection signal, and electrically connected with a microcontroller unit and a capacitor unit;
  the microcontroller unit configured to calculate an operating frequency of the field-effect transistor according to the detection signal, thereby determining whether an operating frequency is in a preset state, and transmitting a control signal according to a determination result, wherein the microcontroller unit transmits the control signal when the determination result is in a frequency multiplication state, and wherein the detection unit continuously captures the new detection signal when the determination result is in the preset state; and
  the capacitor unit configured to adjust the operating frequency of the field-effect transistor according to the control signal;
  wherein the detection signal is a voltage waveform period at any two ends of the field-effect transistor;
  wherein the detection unit comprises a DC voltage source, a first comparator, a first resistor, a second resistor, a third resistor, and a fourth resistor, and wherein the first comparator comprises a first inverting input end, a first non-inverting input end, and a first output end, and wherein the first inverting input end is electrically connected to the DC voltage source through the first resistor and is electrically connected to the ground through the second resistor, and wherein the first non-inverting input end is electrically connected to the ground through the third resistor while the first non-inverting input end is electrically connected to the first output end and the microcontroller unit through the fourth resistor, and wherein the first output end is electrically connected to the microcontroller unit.

2. The electromagnetic interference regulator as claimed in claim 1, wherein the detection signal is one of a capacitive voltage of the capacitor unit, a capacitive current of the capacitor unit, or a combination thereof.

3. The electromagnetic interference regulator as claimed in claim 2, wherein the detection unit further comprises a second comparator, a fifth resistor and a sixth resistor;
  wherein the second comparator comprises a second inverting input end, a second non-inverting input end, and an second output end;
  wherein the first inverting input end is electrically connected to the DC voltage source through the first resistor and is electrically connected to the ground through the second resistor, and wherein the first non-inverting input end is electrically connected to the ground through the third resistor while the non-inverting input end is electrically connected to the first output end and the microcontroller unit through the fourth resistor, and wherein the first output end is electrically connected to the microcontroller unit; and
  wherein the second inverting input end is electrically connected to the DC current source, and wherein the second non-inverting input end is electrically connected to the ground through the fifth resistor while the second non-inverting input end is electrically connected to the second output end and the microcontroller unit through the sixth resistor; and
  wherein the second output end is electrically connected to the microcontroller unit.

4. The electromagnetic interference regulator as claimed in claim 2, wherein the capacitor unit comprises a first capacitor, a second capacitor, a third capacitor, a first switch, a second switch, and a third switch; and
  wherein a first end of the field-effect transistor is electrically connected to one end of each of the first capacitor, the second capacitor, the third capacitor, and the detection unit while the other end of the first capacitor is electrically connected to a second end of the field-effect transistor and the detection unit through the first switch, and wherein the other end of the second capacitor is electrically connected to the second end of the field-effect transistor and the detection unit through the second switch, and wherein the other end of the third capacitor is electrically connected to the second end of the field effect and the detection unit through the third switch.

* * * * *